(12) United States Patent
Lapworth

(10) Patent No.: US 9,087,165 B2
(45) Date of Patent: Jul. 21, 2015

(54) AUTOMATIC EXTREMUM DETECTION ON A SURFACE MESH OF A COMPONENT

(75) Inventor: Bryan L. Lapworth, Duffield (GB)

(73) Assignee: ROLLS-ROYCE PLC, London (GB)

( * ) Notice: Subject to any disclaimer, the term of this patent is extended or adjusted under 35 U.S.C. 154(b) by 484 days.

(21) Appl. No.: 13/475,286

(22) Filed: May 18, 2012

(65) Prior Publication Data

US 2012/0316842 A1 Dec. 13, 2012

(30) Foreign Application Priority Data

Jun. 7, 2011 (GB) .................................. 1109482.8

(51) Int. Cl.
*G06F 17/50* (2006.01)
(52) U.S. Cl.
CPC .................. *G06F 17/5018* (2013.01)
(58) Field of Classification Search
CPC ............................. G06F 17/5018; G06F 17/50
USPC ............................................................ 703/2
See application file for complete search history.

(56) References Cited

U.S. PATENT DOCUMENTS

| | | | | |
|---|---|---|---|---|
| 6,608,627 | B1 * | 8/2003 | Marshall et al. .............. | 345/619 |
| 2012/0069017 | A1 * | 3/2012 | Zheng et al. .................. | 345/420 |

OTHER PUBLICATIONS

Ashley Hartner et al., "Object Space Silhouette Algorithms," 2003, SIGGRAPH 2003 Course Notes, eight pages.*
Ronald L. Graham et al., "Finding the convex hull of a simple polygon," 1981, Stanford University, pp. 1-9.*
Michael A. Yukish, "Algorithms to identify pareto points in multi-dimensional data sets," 2004, Pennsylvania State University, 143 pages.*
Shahpar et al., "Padram: Parametric Design and Rapid Meshing System for Turbomachinery Optimisation," *Proceedings of the ASME Turbo Expo 2003*, Jun. 2003, pp. 579-590, vol. 6a, The American Society of Mechanical Engineers, New York, USA.
Clemen, "Aero-mechanical optimisation of a structural fan outlet guide vane," *Structural and Multidisciplinary Optimization*, Jan. 13, 2011, pp. 125-136, vol. 44, No. 1, Springer.
Sethian, "Level Set Methods and Fast Marching Methods" *Evolving Interfaces in Computational Geometry, Fluid Mechanics, Computer Vision, and Materials Science*, 1999, pp. xvii-xx, 3-13 and 360-375, Cambridge University Press.
Forcadel, "Fast Marching Method," Sep. 2008, pp. 1-83, Universite Paris-Dauphine.
Partial European Search Report issued in European Application No. 12168517 dated Apr. 11, 2014.
Brief Communication issued in European Application No. 12168517.6 dated May 27, 2014.

* cited by examiner

*Primary Examiner* — Kamini S Shah
*Assistant Examiner* — Russ Guill
(74) *Attorney, Agent, or Firm* — Oliff PLC

(57) ABSTRACT

A datum line, such as the leading or trailing edge of an aerofoil component, is identified on a surface mesh of the component for use in a simulation. The method includes the steps of: defining a reference coordinate system including a direction X, which may be a general flow direction over the component; defining a span variable that varies along the component in a forwards marching direction, for example corresponding to the root to tip direction of the aerofoil; selecting a first frontal node on the datum line; using a Pareto front algorithm to define the datum line at an extremity of the surface mesh with respect to the X direction, the Pareto front algorithm evaluating a criterion for dominated nodes and operating on a Pareto variable to select successive connected frontal nodes that form the datum line.

15 Claims, 6 Drawing Sheets

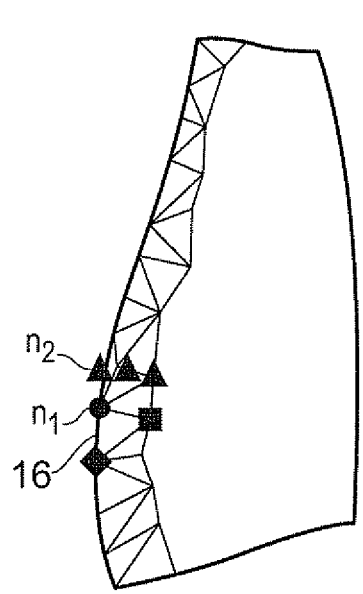
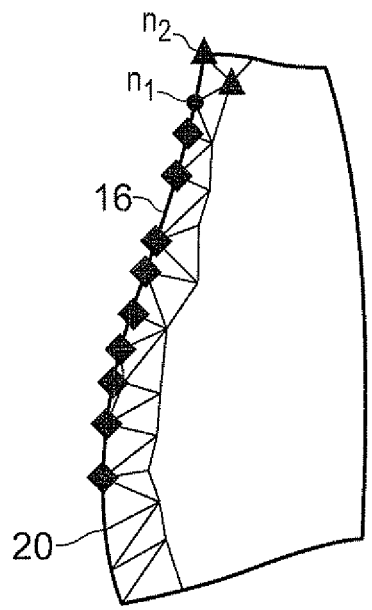
FIG. 5　　　　　　　　FIG. 6
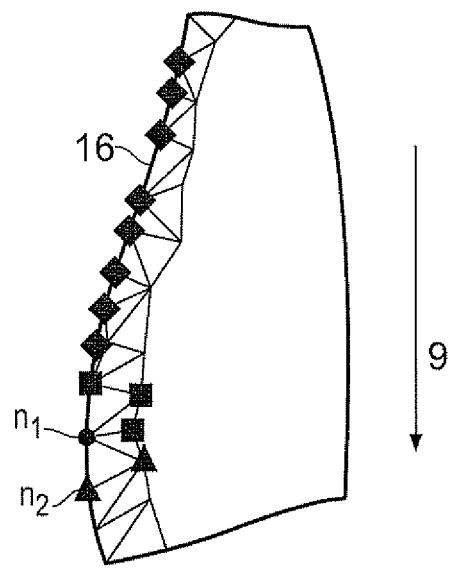
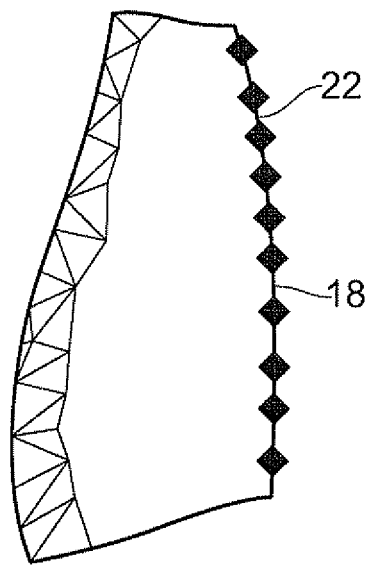
FIG. 7　　　　　　　　FIG. 8

AUTOMATIC EXTREMUM DETECTION ON A SURFACE MESH OF A COMPONENT

This invention relates to a method for automatically identifying a datum line on a surface mesh representation of a component, and is particularly, although not exclusively, concerned with the detection of leading and trailing edges of aerofoils represented in meshes for computational fluid dynamics (CFD) simulations.

Fluid dynamicists use Computational Fluid Dynamics (CFD) to provide simulations of fluid flows. Fluid flow may be simulated by constructing a model of a geometry of interest and a fluid flow domain associated with that geometry, then performing calculations to simulate the fluid flow in and around this geometry using a computer.

A three dimensional CFD model may use a mesh of cells to represent the fluid flow domain. Cells are delimited by faces, which faces are delimited by edges, which edges terminate at nodes. A mesh for a two dimensional CFD model, or a surface mesh (i.e. the mesh on a surface of a 3D model, whether planar or curved) comprises faces, edges and nodes only. Some simulations demand a high mesh resolution to provide sufficient solution quality. A high mesh resolution results in a large number of cells. A typical 3D model comprises between several thousand and many million cells.

A CFD simulation generally uses finite volume methods to discretise the numerical simulation of the flow over the mesh.

The simulation of turbulence is important in the selection of a numerical simulation approach. Unlike laminar flow, turbulent flow is characterised by eddies and vortices of many different time and length scales that interact with one other to create a complex, dynamic flow pattern. As a result, turbulence is difficult to simulate.

Although it is possible to perform a simulation without using a turbulence model by using direct numerical simulation (DNS) methods, this is an extremely expensive approach because it requires a very high mesh resolution to capture all the detail of turbulence patterns. Less expensive options use a turbulence model to simulate or approximate the effect of turbulence.

Several such numerical simulation approaches are commonly available and well known in the art, for example the Reynolds-averaged Navier Stokes (RANS), Detached Eddy Simulation (DES) and Large Eddy Simulation (LES) approaches. A fluid dynamicist may select a numerical simulation approach and mesh resolution according to the physics of the flow to be simulated, the simulation quality required, the computational expense of the approach and the effort and skill required of the fluid dynamicist to prepare the simulation, among other things.

A fluid dynamicist may adjust the parameters of a CFD simulation by changing the boundary conditions, for example the temperature of a wall or the inlet flow rate of a duct. Additionally, it is known to intervene manually in the simulation by adjusting parameters of the CFD solution (e.g. the rate of turbulence production) at specific faces or cells of the mesh in order to force certain flow behaviours.

For example, a fluid dynamicist may have access to empirical data relating to the position on an aerofoil at which the transition between laminar and turbulent flow occurs. This data may be available for a specific aerofoil and operating condition or may otherwise reside in a transition model that is able to predict the transition point based on input variables and empirically derived trends.

The location of the transition point is an important factor in determining the flow behaviour and performance characteristics of aerofoils, but is difficult to predict accurately using a CFD turbulence model.

Therefore, a fluid dynamicist may wish to apply an empirically derived transition point to an aerofoil within a CFD simulation. He may wish to prescribe a fixed transition point on the aerofoil, or otherwise specify a portion on the aerofoil in which a transition model may be applied to predict a transition point based on local flow criteria.

Additionally, a fluid dynamicist or other individual may wish to identify non-local geometrical features of a component within a simulation and prescribe a location or region on that component with respect to these non-local features for various purposes, for example, for use in a model within that simulation.

Although computer aided design (CAD) tools may use a number of parameters such as span, camber and the locations of the leading and trailing edges to define the shape of an aerofoil, or other global information such as NURBS (Non-Uniform Rational Basis Spline) surfaces, a CFD simulation generally does not have access to this type of global information and the underlying geometrical definition of the component is not available to the CFD solver.

A CFD simulation iteratively solves the equations of the numerical simulation at the nodes, faces or cells of the mesh that represent the geometry, and only needs to know flow based properties such as the wall velocity and temperature which are stored within the simulation at each iteration and derivable from the boundary conditions. Thus, the simulation does not necessarily need to know which parts of the mesh correspond to geometrical features, for example, the leading edge of an aerofoil, in order to work.

The solver routines are generally constructed such that the calculations performed at a particular cell or node are based on the values held at neighbouring cells or nodes, and therefore the simulation needs to know the local information concerning the mesh, for example the connectivity of the mesh.

Accordingly, a method for automatically identifying geometrical features of an aerofoil surface mesh using local mesh information available within a simulation is required.

Additionally, a method of defining a location or region on that aerofoil surface mesh with respect to these geometrical features for use by the simulation is required.

A currently known method for defining geometrical features, locations and regions on an aerofoil requires a structured mesh.

A structured 2D or 3D mesh is arranged such that the connectivity corresponds to a regular 2D or 3D array respectively. A structured mesh is therefore constrained to comprise quadrilateral faces in 2D, and hexahedral cells in 3D. Owing to the regular connectivity, the neighbour of a first node may be readily determined by the position of that first node in the array.

With reference to FIG. 1, a structured surface mesh 12 on an aerofoil surface may comprise chord-wise rows of nodes $i_1, i_2, \ldots, i_n$ and span-wise columns of nodes $j_1, j_2, \ldots, j_n$.

This global indexing of structured meshes means that rows or columns of nodes substantially corresponding to geometrical features such as the leading or trailing edge of an aerofoil may be described by an array index of the mesh.

A known method of defining a location or geometrical feature on an aerofoil for use by a simulation comprises the steps of:

1. Manually interrogating the mesh to identify the array index of i) a span-wise column or ii) a chord-wise row of nodes corresponding to a desired i) chord-wise or ii) span-wise location on the aerofoil;

2. If a region is to be selected, repeating step 1 to identify array indices corresponding to nodes that delimit the desired region;

3. Communicating the array index or indices to the simulation to define the location or geometrical feature of interest.

However, this method can be employed only when the mesh is a structured mesh.

Furthermore, a significant amount of specialist user input and manual interrogation of the mesh is required to define the feature, location or region, and the method is therefore expensive to perform.

The user is required to define the feature, location or region manually which could be extremely time consuming for multi-aerofoil simulations such as a blade array within a gas turbine engine. Furthermore, the user interaction required by the known method prevents the execution of a fully automated analysis loop comprising steps of automatic geometry creation and/or meshing, defining a location or feature on an aerofoil and performing a simulation. Such fully automated analysis loops are becoming increasingly important in the art for assessment of a series of aerofoils, or in automated design optimization procedures in which an aerofoil profile may be automatically generated.

Further still, the operations and calculations performed by the user and communicated to the CFD mesh are not based on intuitive terminology or tangible variables. For example, the user may wish to define a location based on a percentage of the chord of the aerofoil, yet he is constrained to deal with array indices corresponding to mesh locations. As such, the method is also prone to user error and is difficult to check. The method is particularly difficult for multi-block meshes (described below) since the indexing directions change, at the block interfaces.

In order to produce meshes for complex geometry, multi-blocks (M-B) are often used to divide the domain into simpler domains, e.g. using the Rolls-Royce PADRAM code: Shahpar, S., and Lapworth, L., "PADRAM: Parametric Design and Rapid Meshing System for Turbomachinery Optimisation", ASME GT2003-38698, Atlanta, Ga., 2003.

A major problem for multi-block structural meshes is the difficulty in generating meshes for complicated geometries and the long time spent by engineers generating multi-block topologies. The generation of the multi-block structures can be very time-consuming and sometimes impossible.

An alternative is to use an unstructured mesh. A 3D unstructured mesh may comprise tetrahedral, quadrilateral and/or other polyhedral cells. A 2D unstructured mesh or an unstructured surface mesh may comprise triangles, quadrilaterals and/or other polygon faces. Unlike structured meshes, unstructured meshes are characterised by irregular connectivity. The connectivity of neighbouring nodes and cells do not necessarily correspond to neighbouring positions in an array. Accordingly, a separate array structure is required to define the connectivity.

It is well known in the art that it is significantly easier to generate unstructured meshes than structured meshes. Unstructured meshes give greater geometric flexibility to an engineer. However, accurate manual identification of features such as leading and trailing edges on unstructured meshes would be extremely difficult and time consuming.

According to a first aspect of the invention there is provided a method of defining a datum line on a surface mesh of a component for use in a simulation, the surface mesh comprising nodes interconnected by edges, the method comprising the steps of:
 a) defining a reference coordinate system including a direction X;
 b) defining a span variable that varies monotonically along the component in a forwards marching direction that is not coincident with the direction X;
 c) selecting a first frontal node on the datum line;
 d) using a Pareto front algorithm to define a datum line at an extremity of the surface mesh with respect to the X direction, the Pareto front algorithm evaluating a criterion for dominated nodes and operating on a Pareto variable to select successive frontal nodes that form the datum line, wherein the Pareto variable is the X coordinate and the criterion for dominated nodes is a span value less than that of the selected frontal node.

The first frontal node may be at an extremum of the surface mesh with respect to the X-coordinate.

Pareto fronts are known in the field of optimization, particularly multi-criteria or multi-objective optimization, wherein an optimal output of a system is sought while other parameters are varied. The maximum or minimum of the Pareto variable is sought along the front, i.e. as the front marches monotonically along the component in the forward marching direction by selecting successive frontal nodes.

According to a second aspect of the invention there is provided a method of identifying a datum line on a surface mesh of a component for use in a simulation, the surface mesh comprising nodes interconnected by edges, the method comprising the steps of:
 a) defining a reference coordinate system including a direction X;
 b) defining a search criterion for the X coordinate as either a minimum or a maximum;
 c) defining a normalised span variable that varies monotonically along the component in a direction other than the direction X, and attributing values of the normalised span variable to all nodes on the surface mesh of the component;
 d) defining a forward marching direction;
 e) locating and selecting a node $n_1$ from a set of all nodes N on the surface mesh, which node $n_1$ satisfies the search criterion for the X coordinate to the greatest extent;
 f) assigning the node $n_1$ to a set of nodes $N_d$ corresponding to the datum line;
 g) identifying a set of nodes $N_t$ which have a normalised span variable corresponding to the same spanwise position or a spanwise position forward of the node $n_1$ with respect to the forward marching direction, and are connected to the node $n_1$ by an edge;
 h) selecting a node $n_2$ from the set of nodes $N_t$, which node $n_2$ satisfies the search criterion for the X coordinate to the greatest extent;
 i) adding node $n_2$ to the set of nodes $N_d$ corresponding to the datum line;
 j) redefining a node $n_1$ as the currently selected node $n_2$, and repeating steps (g) to (j) to select successive nodes $n_2$.

The datum line is formed of the successive frontal nodes and the respective interconnecting edges between them.

The present invention has particular application in the simulation of flow over aerofoils, in which the marching direction is the lengthwise direction of the aerofoil and the chord-wise direction is the direction between the leading and trailing edges of the aerofoil. The present invention is also applicable to components other than aerofoils. However, for ease of explanation, references to span and chord are used generally in this specification to designate two generally perpendicular directions on a surface of the component.

The reference coordinate system may be the underlying coordinate system of the mesh or component, or any projection thereof.

The spanwise direction may be quasi-orthogonal or orthogonal to the direction X.

The normalised span variable may vary from a first value at a first predetermined boundary to a second value at a second predetermined boundary. The first and second values may be 0 and 1 respectively.

The steps (g) to (j) may be repeated until a node $n_2$ is selected that lies on a predetermined boundary of the surface mesh.

The criterion for determining whether a node $n_2$ lies on a predetermined boundary may be a value of the normalised span variable.

A method according to the second aspect of the invention may further comprise the steps of reversing the forward marching direction; selecting a node $n_1$ from any of the set of nodes $N_d$ corresponding to the datum line; and repeating steps (g) to (j). The node $n_1$ may also be selected as the previous selected node $n_2$ or redefined using the search criterion for the X direction by repeating step (e).

The edges of the surface mesh may define faces.

The predetermined boundary or one of the predetermined boundaries of the surface mesh may be located by identifying edges in the surface mesh that are respectively connected to one face only, and therefore lie on the periphery of the surface mesh.

The predetermined boundary or one of the predetermined boundaries of the surface mesh may be located on the basis of the rate of change of face normals between adjacent faces. For example, the tip of a blade or aerofoil may have a high rate of change of face normals between adjacent faces.

According to a third aspect of the invention, there is provided a method of identifying first and second datum lines on a surface mesh of a component for use in a simulation, the surface mesh of the component having two predetermined boundaries, wherein the first and second datum lines are independently identified by a method in accordance with the second aspect of the invention wherein the search criterion for the X coordinate is defined respectively as a minimum and a maximum, the first and second datum lines intersecting the predetermined boundaries and dividing the surface mesh of the component into first and second parts.

According to a fourth aspect of the invention, there is provided a method of defining at least one portion on a surface mesh of a component for use in a simulation, wherein a chord variable is defined to vary between first and second datum lines, the first and second datum lines being identified by a method in accordance with the third aspect of the invention, wherein the criterion for each portion is expressed in terms of chord-wise and/or spanwise ranges Each portion may be a point, line or region on the surface mesh of the component.

The component may be an aerofoil. The direction X may correspond to a substantially upstream to downstream direction with respect to the aerofoil component. The span variable may vary in a spanwise direction with respect to the aerofoil component.

Two predetermined boundaries of an aerofoil surface mesh may be defined as the root and tip respectively based on the coordinates of the respective boundaries. For example, the root of an aerofoil in a gas turbine has a lower radial coordinate than the tip.

The root of an aerofoil in a gas turbine may correspond to the junction of a blade (the aerofoil) with an annulus. The root of an aerofoil for an aircraft may correspond to the junction of the wing and the fuselage.

According to a fifth aspect of the invention, there is provided a method of applying a model to a simulation, the model requiring a portion of an aerofoil surface mesh to be selected, the portion of the aerofoil surface mesh being selected by a method in accordance with the fourth aspect of the invention.

The model may be a transition model and the simulation may be a CFD simulation.

The transition model may use the local flow conditions predicted by the CFD simulation to predict a transition point within the portion, the portion being a region on the aerofoil surface mesh.

The transition model may define the entirety of a portion to have laminar flow conditions, the portion being a region on the aerofoil surface mesh.

The transition model may define transition to occur at a pre-determined portion, the portion being a line on the aerofoil surface mesh.

A method in accordance with the third, fourth or fifth aspects of the invention wherein the component is an aerofoil may further comprise the steps of:
  a) calculating the area of the first part of the surface mesh;
  b) calculating the area of the second part of the surface mesh;
  c) defining the part of the surface mesh with the greater area as the suction side;
  d) defining the part of the surface mesh with the lesser area as the pressure side.

The respective areas of the first and second parts may be calculated by:
  a) selecting a node within the surface mesh that does not lie on the first or second datum line and assigning this node to a set of nodes $S_1$;
  b) identifying the nodes connected to nodes within the set $S_1$, and assigning these nodes to the set of nodes $S_1$ unless they lie on the first or second datum line or a predetermined boundary of the surface mesh;
  c) repeating step b) until no further nodes can be assigned to the set of nodes $S_1$
  d) assigning all nodes that are not assigned to the set of nodes $S_1$ to a set of nodes $S_2$ unless they lie on the first or second datum line or a predetermined boundary of the surface mesh;
  e) summing the areas of faces of the mesh defined by the nodes belonging to the sets $S_1$ and $S_2$ respectively.

A transition model in accordance with the fifth aspect of the invention may behave differently depending on whether the portion of the aerofoil surface is on a pressure side or a suction side of the aerofoil.

The values of the chord variable may be calculated at each node using a discretised Poisson equation. The chord variable may be normalised. The chord variable may vary from a first value on a first datum line to a second value on a second datum line. The first and second values may be 0 and 1 respectively.

The values of the span variable may be calculated at each node using a discretised Poisson equation.

The value of the span or chord variable at each node may be found by discretising the Poisson equation for span or chord respectively. The discretisation may be an edge based discretisation. The value of the normalised span variable or chord variable may be found using any iteration scheme (e.g. conjugate gradient) or by direct matrix inversion.

The invention may comprise any combination of the features and/or limitations referred to herein, except combinations of such features as are mutually exclusive.

A method in accordance with the invention eliminates the requirement for a user to manually interrogate a surface mesh of a component in order to define a datum line, location or region on the surface mesh.

A method in accordance with the invention may operate on both structured and unstructured meshes.

A method in accordance with the invention may interpret a criterion for defining a region or location on the surface mesh of a component in terms of meaningful variables or terms such as a percentage of the chord or span, as opposed to requiring specific mesh indices.

A method in accordance with the invention may automatically detect the leading edge and trailing edge of an aerofoil surface mesh and separate the aerofoil surface mesh into suction and pressure sides using only local information from an unstructured or structured mesh in the absence of global geometry information such as NURBS surfaces.

A CFD simulation that relies on the knowledge of the location of datum lines corresponding to geometric features such as the leading edge and trailing edge of an aerofoil may use a method in accordance with the invention to make this information available to the solver.

For a better understanding of the invention, and to show how it may be carried into effect, reference will now be made, by way of example, to the accompanying drawings, in which.

Figure 1:
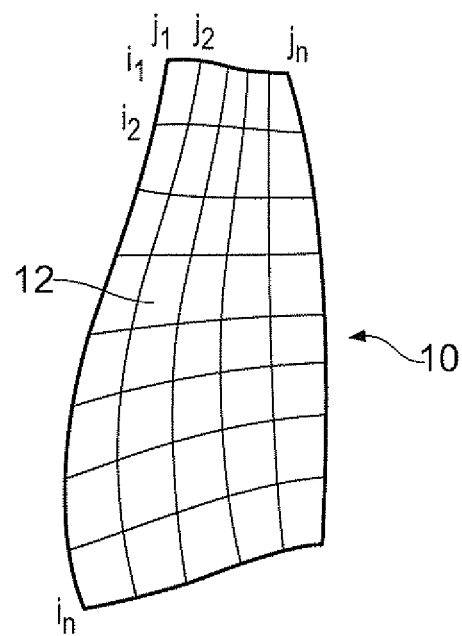
FIG. 1 shows a structured surface mesh on an aerofoil.
Figure 2:
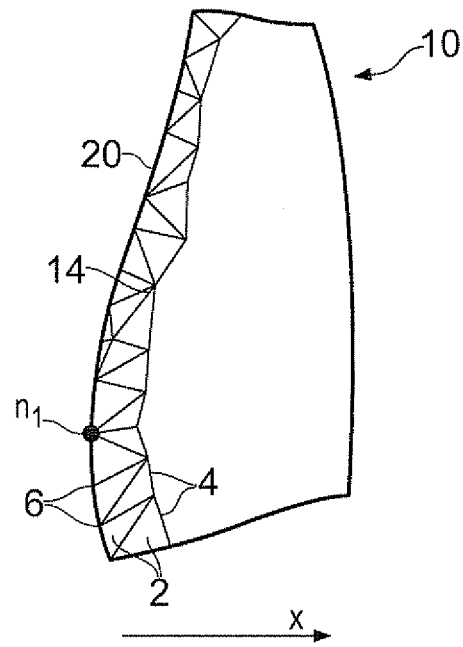
FIG. 2 shows part of an unstructured surface mesh on an aerofoil.
Figure 3:
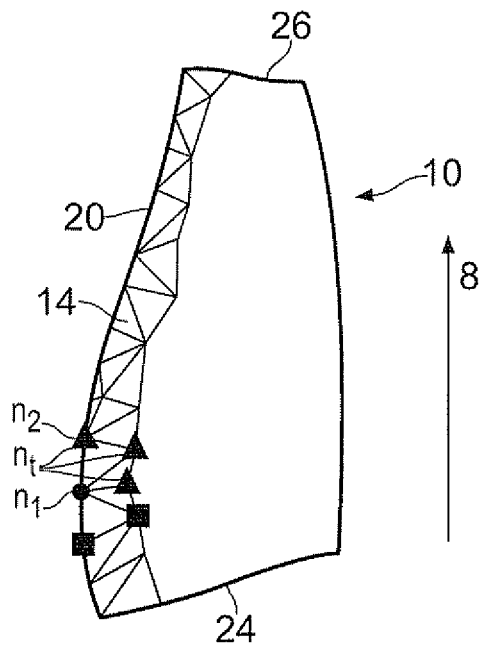
FIG. 3 shows a Pareto front algorithm operating on the surface mesh of FIG. 2.
Figure 9:
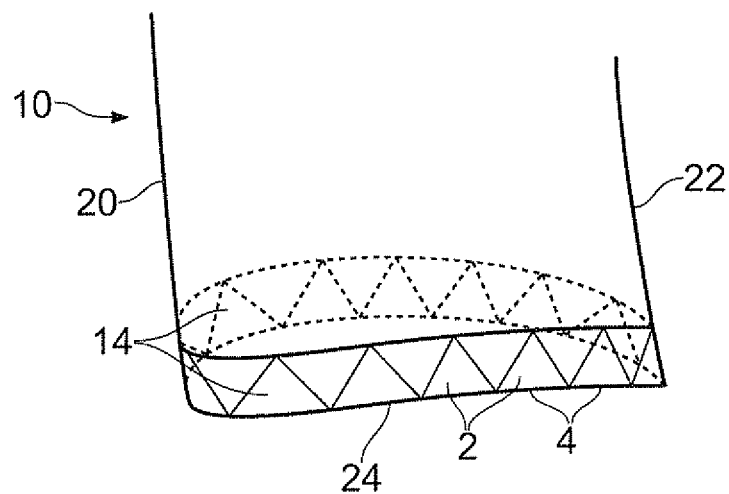
Figure 10:
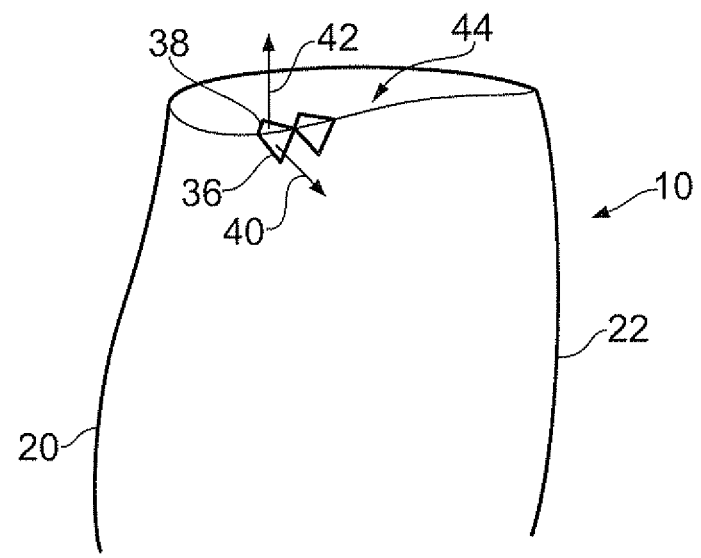

FIG. 5 corresponds to FIG. 3 but shows a further stage in the operation of the Pareto front algorithm;

FIG. 6 corresponds to FIG. 3 but shows a yet further stage in the operation of the Pareto front algorithm;

FIG. 7 corresponds to FIG. 3 but the Pareto front algorithm operating in a reversed forward marching direction;

FIG. 8 shows a second datum line identified at the trailing edge of the aerofoil surface mesh of FIG. 2;

FIG. 9 shows a predetermined boundary at the root of the aerofoil surface mesh of FIG. 2;

FIG. 10 shows a predetermined boundary at the tip of the aerofoil surface mesh of FIG. 2.

Figure 11:
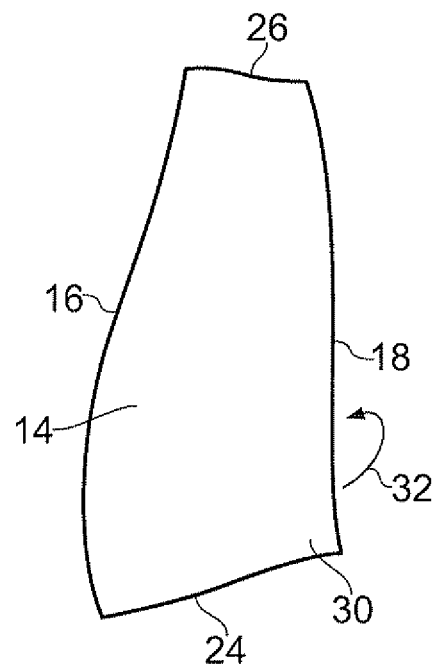

FIG. 11 represents first and second datum lines at the leading and trailing edges and predetermined boundaries at the root and tip of the aerofoil surface mesh of FIG. 2.

Figure 12:
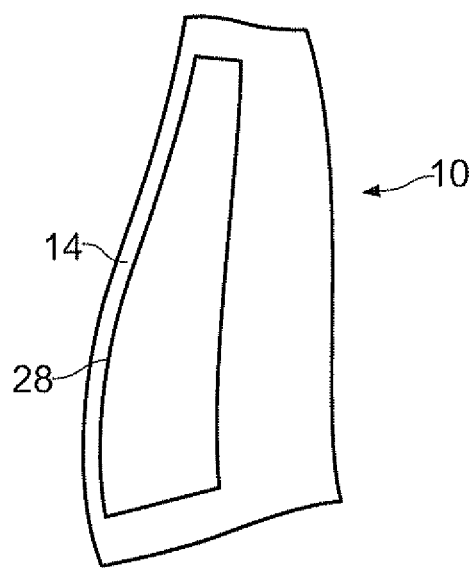

FIG. 12 corresponds to FIG. 11 and shows a portion defined on the suction side of the aerofoil surface mesh 14.

Figure 13:
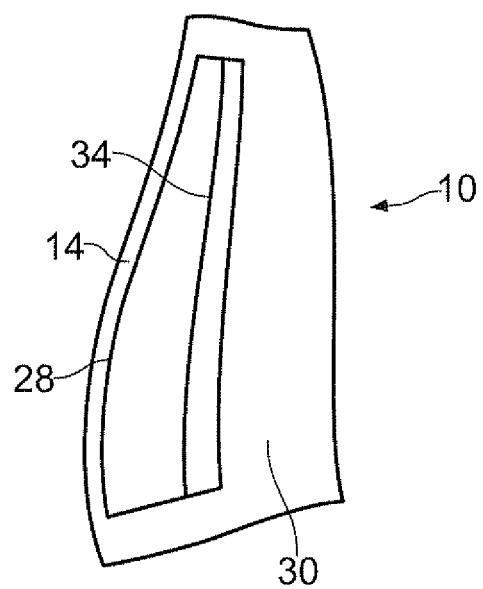

FIG. 13 corresponds to FIG. 12 and shows a transition point defined by a transition model within the portion on the aerofoil surface mesh.

An example method in accordance with the invention is described with reference to an example surface mesh 14 of an aerofoil 10 depicted in FIG. 2. The surface mesh 14 is an unstructured mesh with irregular connectivity. The surface mesh 14 comprises a plurality of faces 2, each face comprising a plurality of edges 4, each edge terminating at nodes 6.

FIG. 2 shows a direction X corresponding to a substantially upstream to downstream direction of fluid flow over the aerofoil 10.

A search criterion for the X coordinate is initially defined as a minimum. FIG. 2 shows a node $n_1$ that has been selected as the node on the surface mesh 1 that satisfies the search criterion for the X coordinate to the greatest extent, and is consequently the node which is furthest upstream with respect to the X direction. Node $n_1$ is the first node on the datum line 16 or Pareto front (FIGS. 5 to 7). Because the direction X that has been selected corresponds to a substantially upstream to downstream direction, the node $n_1$ with the minimum X coordinate lies substantially on the geometric leading edge 20 of the aerofoil 10.

Node $n_1$ is assigned to a set of nodes $N_d$ representing the datum line or Pareto front.

FIG. 3 depicts a Pareto front technique that starts at the initial frontal node $n_1$ and marches along a Pareto front until a datum line 16 (FIGS. 5 to 7) substantially corresponding to the leading edge 20 of the aerofoil 10 is defined.

A normalised span variable is defined at all nodes on the surface mesh of FIG. 3. The normalised span variable varies between 0 and 1 in a spanwise direction from the root 24 to the tip 26 of the aerofoil surface mesh 14. The value of the normalised span variable is 0 at all nodes on the predetermined root periphery 24 and 1 at all nodes on the predetermined tip periphery 26. The value of the normalised span variable at each node gives the fractional distance of each node between the root 24 and tip 26 of the mesh.

The value of the normalised span variable at all other nodes on the surface mesh is governed by a Poisson equation.

The forward marching direction is depicted by the arrow 8 of FIG. 3 and is defined as a substantially root 24 to tip 26 spanwise direction.

The normalised span values are used to control the marching of the Pareto front and set the termination criterion for the Pareto front.

Nodes with a normalised span variable corresponding to a spanwise position less than that of the node $n_1$ with respect to the forward marching direction are defined as dominated nodes, meaning that they cannot belong to the datum line or Pareto front.

Nodes with a normalised span variable corresponding to the same spanwise position or a spanwise position forward of the node $n_1$ with respect to the forward marching direction are defined as non-dominated nodes.

FIG. 3 shows nodes connected to the frontal node $n_1$. Non-dominated nodes are indicated with a triangle. Dominated nodes are indicated with a square. The current frontal node $n_1$ is indicated with a circle.

Figure 4:
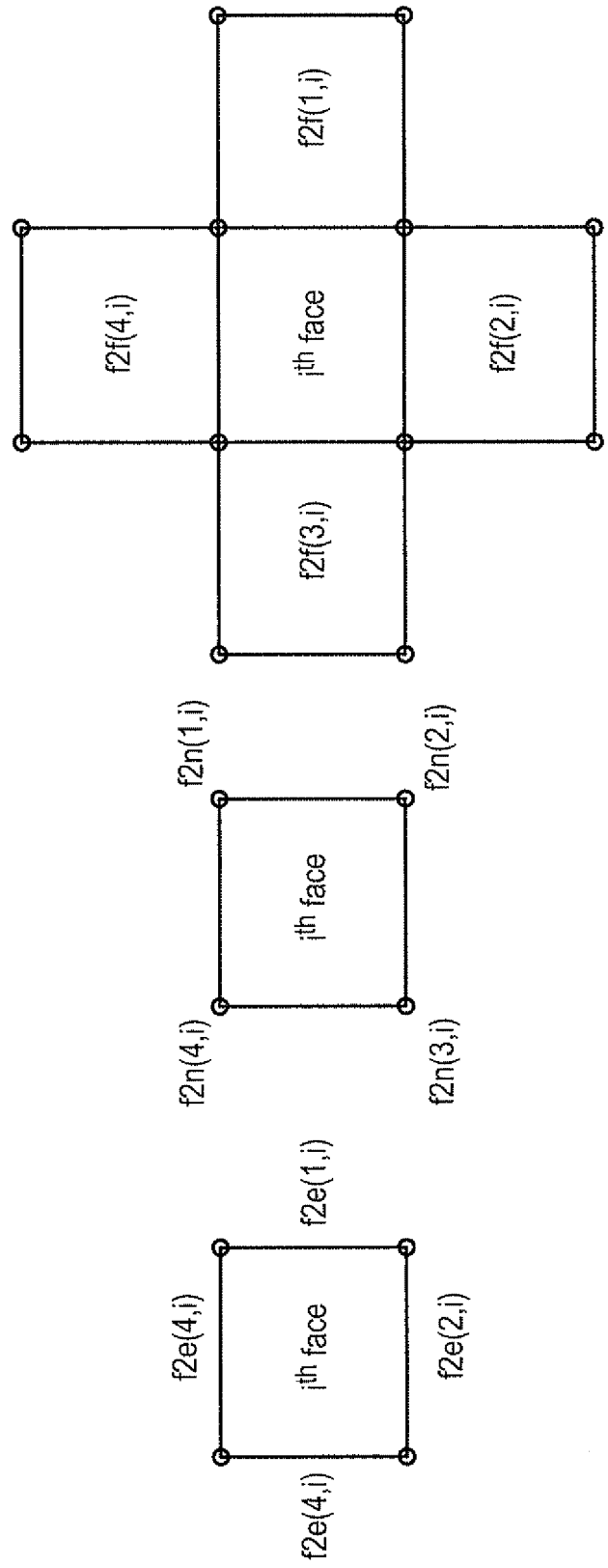
FIG. 4 shows local connectivity arrays for surface mesh entities

The connectivity of the node $n_1$ may be evaluated by interrogating the connectivity arrays associated with the node $n_1$. Connectivity array f2n contains the nodes at vertices of a face. Connectivity array f2e contains the edges forming the periphery of a face. Connectivity array f2f contains neighbouring faces of a face. Connectivity array e2n contains nodes at ends of an edge. An example set of connectivity arrays are shown for an example set of quadrilateral faces in FIG. 4. It will be appreciated that similar arrays exist for triangular or polygonal faces. These are the commonly used connectivity arrays, but any suitable connectivity arrays may be used.

The three nodes $n_t$ shown in FIG. 3 are target nodes that are connected to node $n_1$ by an edge and are also non-dominated nodes. These nodes may be referred to as target nodes because one of them will be the next node $n_2$ on the datum line 16 or Pareto front.

Since the search criterion for the X direction is a minimum, the node $n_2$ that is selected from the target nodes $n_t$ is that with the lowest X coordinate.

Once the node $n_2$ is selected, a marching algorithm continues along the Pareto front or datum line 16 by redefining a new frontal node $n_1$ as the currently selected node $n_2$, as shown in FIG. 5. The previous frontal node is indicated with a diamond symbol.

Previously described steps of the method are repeated to record frontal nodes to the datum line 16 or Pareto front (i.e. assigning them to the set of nodes $N_d$) and identify successive frontal nodes. These steps are repeated until a node $n_2$ that lies on a predetermined boundary 26 is selected as shown in FIG. 6, at which point the marching algorithm in the forward marching direction is terminated.

Since the normalised span variable has been defined such that all nodes on the predetermined tip boundary 26 of the aerofoil surface mesh 14 have a value of 1, the criterion for determining whether a node $n_2$ lies on the predetermined tip boundary 26 is a normalised span variable of 1.

Once the boundary 26 is reached, the marching algorithm reverts to the initial frontal node 12, shown in FIG. 7 as a circle. The forward marching direction is redefined in the reverse direction, shown by an arrow 9 in FIG. 7.

FIG. 7 thus shows the marching algorithm continuing to select successive nodes $n_2$ in a tip 26 to root 24 direction, i.e. in a direction of decreasing span. Although, as mentioned above, the first node $n_1$ for the reversed marching algorithm is the original node $n_1$ that satisfied the search criterion for the X coordinate to the greatest extent, it is possible for any of the frontal nodes $n_d$ previously selected to become the first node $n_1$ of the reversed marching algorithm.

The marching algorithm continues until a newly selected node $n_2$ that lies on the predetermined root boundary 24 is selected, at which point the marching algorithm in the reversed forward marching direction 9 is terminated.

Since the normalised span variable has been defined such that all nodes on the predetermined root boundary 24 of the aerofoil surface mesh 14 have a value of 0, the criterion for determining whether a node $n_2$ lies on the predetermined root boundary 24 is a normalised span variable of 0.

Once the marching algorithm in the reversed forward marching direction is terminated, a datum line 16 or Pareto front corresponding to the leading edge 20 of the aerofoil surface mesh 14 has been identified.

FIG. 8 shows a datum line 18 or Pareto front corresponding to the trailing edge 22 of the aerofoil surface mesh 14 that has been identified using the method described above with the search criterion for the X coordinate defined as a maximum.

FIG. 9 depicts the root 24 of the aerofoil surface mesh 14. The aerofoil surface mesh 14 has an open end at the root 24. The predetermined boundary of the surface mesh at the root 24 is identified by looking for all edges 4 in the surface mesh 14 which are connected to one face 2 only. These edges constitute a periphery of the aerofoil, and may be sorted into a closed contour that defines the boundary 24.

FIG. 10 depicts the tip 26 of the aerofoil surface mesh 14. The surface mesh 14 includes a region 44 extending over the tip of the aerofoil. For the purpose of identifying leading and trailing edges (or other datum lines) it is necessary to terminate the marching algorithm at the tip, otherwise the datum line will continue to be generated over the tip surface. Consequently, a predetermined boundary 26 at the tip of the aerofoil has been identified by calculating the rate of change of the face normals between adjacent faces in the mesh. Two example faces 36 and 38 are shown with face normal directions 40 and 42 respectively. Sudden changes in the direction of the face normals between adjacent faces are used to determine a boundary 26 at the tip of the aerofoil surface mesh.

FIG. 11 depicts the aerofoil surface mesh 14 with datum lines 16, 18 identified at the leading edge 20 and trailing edge 22. These datum lines 16, 18 and the predetermined boundaries at the root 24 and tip 26 divide the aerofoil surface mesh 14 into two surfaces 30, 32.

The nodes belonging to the two surfaces 30, 32 respectively may be identified by seeding an initial node that does not lie on the datum lines or predetermined boundaries. The seed is propagated to nodes that are connected to the initial node and do not lie on the datum lines 16, 18 or predetermined boundaries 24, 26. The propagation is continued for all newly seeded nodes until the seed cannot propagate any further.

All seeded nodes lie on a first side of the aerofoil 30. All unseeded nodes not lying on the datum lines 16, 18 or predetermined boundaries 24, 26 lie on a second side of the aerofoil 32.

The areas of the faces associated with nodes on each side of the aerofoil are summed to calculate the areas of each side of the aerofoil respectively. In this example, the side 30 with the greater area is identified as the suction side 32 and the other side is identified as the pressure side.

A chord variable is defined at all nodes on the surface mesh 14 of FIG. 8. The chord variable varies in a chord-wise direction from the first datum line 16 corresponding to the leading edge 20 to the second datum line 18 corresponding to the trailing edge 22 of the aerofoil surface mesh 14. The chord variable is normalised to be 0 at all nodes on the first datum line 16 and 1 at all nodes on the second datum line 18. The value of the normalised chord variable at each node gives the fractional distance of each node between the leading edge 20 and trailing edge 22 of the aerofoil 10.

FIG. 12 depicts a portion 28 on the aerofoil surface mesh 14 for use in a simulation. The criterion for the portion 28 is expressed in terms of chord-wise and spanwise ranges, so that it comprises an portion, rather than merely a line, on the aerofoil surface mesh. The criterion for the portion 28 of FIG. 12 is a chord-wise range of 10% to 50% chord and a spanwise range of 10% to 90% span. Since the leading and trailing edges 16, 18 and the predetermined boundaries 24, 26 have been identified as described above, the simulation is able to interpret the criterion for the portion 28 in terms of the chord-wise and spanwise ranges and select a region 28 of the surface mesh 14 accordingly.

A practical demonstration of the use of the portion 28 in a simulation is shown in FIG. 13. In this example the portion 28 is a region on the aerofoil surface mesh over which a CFD simulation applies a transition model. FIG. 13 shows a region 28 on the suction side 30 of the aerofoil surface mesh 14 between 10% and 50% chord and 10% and 90% span. The transition model is used to predict when flow over an aerofoil changes from laminar to turbulent flow. The transition model uses empirical information and information taken from the CFD simulation in the defined region 28 to predict where transition occurs in this region 28 and adjusts the parameters of the CFD simulation accordingly. Since the pressure side 32 and suction side 30 of the aerofoil 10 have been determined, the transition model can use this information to calculate the transition point based on empirical information specific to the pressure side or suction side of an aerofoil respectively. For example, FIG. 13 shows a line 34 at approximately 35% chord at which transition is predicted to occur. The transition model may be used to adjust the rate of turbulence generation at positions in the mesh corresponding to this location.

Although a method in accordance with the invention has been described with reference to a surface mesh 14 of an aerofoil 10, the aerofoil 10 is an example component only and methods in accordance with the invention are applicable also to components of other forms.

Methods in accordance with the invention are also applicable to types of simulation other than CFD, for example finite element analysis (FEA).

Although the process described with reference to FIG. 13 relates to a transition model for predicting the point of transition between laminar and turbulent flow in a CFD simulation, methods in accordance with the invention are also applicable to any simulation that uses a model requiring non-local information related to the geometry of a component, for example the position of the extremities of a component or the position of mesh entities (cells, faces, edges, nodes) with respect to datum lines at such extremities.

The present invention provides a method for identifying a datum line which can be performed by a computer either within a CFD simulation or separately. Further, the invention allows a portion to be defined with respect to datum lines based on spanwise and chord-wise criteria, which criteria may be selected by a human operator or defined by an automated process such as a sensitivity study or optimisation. The invention thereby enables the intervention of a human operator in defining the datum line(s) and portion to be reduced or entirely avoided so that the CFD simulations requiring the definition of datum lines and/or a portion can proceed automatically and at enhanced speed. Furthermore, the datum lines are identified in a process which is different from that which a human operator would perform and therefore does not necessarily produce the same result.

The invention claimed is:

1. A computer-implemented method of defining a datum line on a surface mesh of an aerofoil for use in a simulation, the surface mesh of the aerofoil including nodes interconnected by edges, the method comprising the steps of:
  a) defining a reference coordinate system including a direction X with respect to the aerofoil;
  b) defining a span variable that varies monotonically along the aerofoil in a forwards marching direction that is not coincident with the direction X;
  c) selecting a first frontal node n1 on the datum line of the aerofoil;
  d) using a Pareto front algorithm to define a datum line at an extremity of the surface mesh with respect to the X direction of the aerofoil, the Pareto front algorithm evaluating a criterion for dominated nodes and operating on a Pareto variable to select successive connected frontal nodes that form the datum line of the aerofoil, wherein the Pareto variable is the X coordinate and the criterion for dominated nodes is a span value less than that of the selected frontal node n1; and
  e) outputting the defined datum line such that a geometrical feature of the aerofoil is identified for determining a fluid flow domain of a fluid flow across a surface of the aerofoil.

2. The computer-implemented method according to claim 1, wherein the direction X being the direction of fluid flow over the aerofoil and the span variable varying in a spanwise direction with respect to the aerofoil.

3. The computer-implemented method according to claim 1, wherein the values of the span variable at each node are calculated using a discretised Poisson equation.

4. A computer-implemented method of identifying a datum line on a surface mesh of an aerofoil for use in a simulation, the surface mesh the aerofoil including nodes interconnected by edges, the method comprising the steps of:
  a) defining a reference coordinate system including a direction X with respect to the aerofoil;
  b) defining a search criterion for the X coordinate as either a minimum or a maximum value of the X coordinate;
  c) defining a normalised span variable that varies monotonically along the aerofoil in a direction other than the direction X, and attributing values of the normalised span variable to all nodes on the surface mesh of the aerofoil;
  d) defining a forward marching direction with respect to the aerofoil;
  e) locating and selecting a node n1 from a set of all nodes N on the surface mesh, which node n1 satisfies the search criterion for the X coordinate to the greatest extent;
  assigning the node n1 to a set of nodes Nd corresponding to the datum line of the aerofoil;
  g) identifying a set of nodes Nt which have a normalised span variable corresponding to the same spanwise position or a spanwise position forward of the node n1 with respect to the forward marching direction, and are connected to the node n1 by an edge;
  h) selecting a node n2 from the set of nodes Nt, which node n2 satisfies the search criterion for the X coordinate to the greatest extent;
  i) adding node n2 to the set of nodes Nd corresponding to the datum line of the aerofoil;
  j) redefining a node n1 as the currently selected node n2, and repeating steps (g) to (j) to select successive nodes n2;
  k) defining the datum line of the aerofoil corresponding to the set of nodes Nd;
  l) outputting the defined datum line such that a geometrical feature of the aerofoil is identified for determining a fluid flow domain of a fluid flow across a surface of the aerofoil.

5. The computer-implemented method according to claim 4, wherein the steps (g) to (j) are repeated until a node n2 is selected that lies on a predetermined boundary of the surface mesh of the aerofoil.

6. The computer-implemented method according to claim 5, wherein the edges of the surface mesh define faces, and in which the predetermined boundary of the surface mesh of the aerofoil is located by identifying edges in the mesh that respectively partially define one face only.

7. The computer-implemented method according to claim 5, wherein the edges of the surface mesh define faces, and in which the predetermined boundary of the surface mesh of the aerofoil is located on the basis of the rate of change of the face normals between adjacent faces.

8. The computer-implemented method according to claim 4, further comprising the steps of:
  a) reversing the forward marching direction relative to the aerofoil;
  b) selecting a node n1 from any of the set of nodes Nd corresponding to the datum line;
  c) repeating steps (g) to (j).

9. A computer-implemented of identifying first and second datum lines on a surface mesh of an aerofoil for use in a simulation, the surface mesh of the aerofoil having two predetermined boundaries, wherein the first and second datum lines of the aerofoil are independently identified by the respective computer-implemented method according to claim 4 with the search criterion for the X coordinate defined respectively as a minimum and a maximum, the first and second datum lines intersecting the predetermined boundaries and dividing the surface mesh of the aerofoil into first and second parts.

10. A computer-implemented method of defining a portion on a surface mesh of an aerofoil for use in a simulation, wherein a chord variable is defined to vary between first and second datum lines of the aerofoil, first and second datum lines being identified by the computer-implemented method according to claim 9, wherein the criterion for the portion is expressed in terms of chord-wise and/or spanwise ranges of the aerofoil.

11. The computer-implemented method according to claim 10, wherein values of the chord variable are calculated at each node using a discretised Poisson equation.

12. A computer-implemented method of applying a transition model to a CFD simulation, the transition model requiring a portion of an aerofoil surface mesh to be selected, the portion of the aerofoil surface mesh being selected by the computer-implemented method according to claim 10 wherein, the component is an aerofoil, the direction X being to the direction of fluid flow over the aerofoil and the span variable varying in a spanwise direction with respect to the aerofoil.

13. The computer-implemented method according to claim 12, wherein the transition model behaves differently depending on whether the portion of the aerofoil surface mesh is on a pressure side or a suction side of the aerofoil; the method further comprising the steps of:
 a) calculating the area of the first part of the surface mesh;
 b) calculating the area of the second part of the surface mesh;
 c) defining the part of the surface mesh with the greater area as the suction side;
 d) defining the part of the surface mesh with the lesser area as the pressure side.

14. The computer-implemented method according to claim 9, further comprising the steps of:
 a) calculating the area of the first part of the surface mesh of the aerofoil;
 b) calculating the area of the second part of the surface mesh of the aerofoil;
 c) defining the part of the surface mesh with the greater area as the suction side of the aerofoil;
 d) defining the part of the surface mesh with the lesser area as the pressure side; wherein
 the direction of fluid flow over the aerofoil and the span variable varying in a spanwise direction with respect to the aerofoil.

15. The computer-implemented method according to claim 14, wherein the respective areas of the first and second parts are calculated by:
 a) selecting a node within the surface mesh that does not lie on the first or second datum line and assigning this node to a set of nodes S1;
 b) identifying the nodes connected to nodes within the set S1, and assigning these nodes to the set of nodes S1 unless they lie on the first or second datum line or on a predetermined boundary of the surface mesh;
 c) repeating step b) until no further nodes can be assigned to the set of nodes S1;
 d) assigning all nodes that are not assigned to the set of nodes S1 to a set of nodes S2 unless they lie on the first or second datum line or on a predetermined boundary of the surface mesh;
 e) summing the areas of faces of the mesh defined by the nodes belonging to the sets S1 and S2 respectively.

* * * * *